United States Patent [19]
Dabrowski

[11] Patent Number: 5,757,057
[45] Date of Patent: May 26, 1998

[54] LARGE AREA AVALANCHE PHOTODIODE ARRAY

[75] Inventor: Andrzej J. Dabrowski, Los Angeles, Calif.

[73] Assignee: Advanced Photonix, Inc., Camarillo, Calif.

[21] Appl. No.: 882,055

[22] Filed: Jun. 25, 1997

[51] Int. Cl.[6] .................... H01L 31/107; H01L 29/861
[52] U.S. Cl. .................... 257/438; 257/605; 257/606
[58] Field of Search .................... 257/438, 605, 257/606

[56] References Cited

U.S. PATENT DOCUMENTS

| | | |
|---|---|---|
| 4,366,377 | 12/1982 | Notthoff et al. . |
| 4,458,260 | 7/1984 | McIntyre et al. . |
| 4,587,544 | 5/1986 | Webb . |
| 4,637,126 | 1/1987 | Lightstone . |
| 4,654,678 | 3/1987 | Lightstone et al. . |
| 4,745,451 | 5/1988 | Webb et al. . |
| 5,021,854 | 6/1991 | Huth . |
| 5,057,892 | 10/1991 | Iwanczyk . |
| 5,132,747 | 7/1992 | Matsushima et al. . |
| 5,144,381 | 9/1992 | Furuyama et al. . |
| 5,146,296 | 9/1992 | Huth . |
| 5,157,473 | 10/1992 | Okazadi . |
| 5,179,430 | 1/1993 | Torikai . |
| 5,204,539 | 4/1993 | Tsuji et al. . |
| 5,281,844 | 1/1994 | Funaba . |
| 5,290,367 | 3/1994 | Hayashi et al. . |
| 5,311,044 | 5/1994 | Iwanczyk et al. . |
| 5,338,947 | 8/1994 | Watanabe . |
| 5,343,055 | 8/1994 | Davis et al. . |
| 5,346,837 | 9/1994 | Funaba . |
| 5,367,188 | 11/1994 | Kudo . |
| 5,406,097 | 4/1995 | Kusakabe . |
| 5,438,217 | 8/1995 | Ishaque et al. . |
| 5,446,308 | 8/1995 | Piccone et al. . |
| 5,457,327 | 10/1995 | Taguchi . |
| 5,500,550 | 3/1996 | Morishita . |

FOREIGN PATENT DOCUMENTS

| | | |
|---|---|---|
| 54-107375 | 8/1979 | Japan . |
| 55-72083 | 5/1980 | Japan . |

OTHER PUBLICATIONS

Tegeler, E. and Krumrey. M., "Stability of Semiconductor Photodiodes as VUV Detectors", *Nuclear Instruments and Methods in Physics Research* A 282 701–705, 1989.

Hansen, T.E., "Silicon UV–Photodiodes Using Natural Inversion Layers", *Physica Scripta*, vol. 18, 471–475, 1978.

(List continued on next page.)

Primary Examiner—Stephen Meier
Attorney, Agent, or Firm—Knobbe, Martens, Olson & Bear, LLP

[57] ABSTRACT

A large area avalanche photodiode device that has a plurality of contacts formed on a bottom side that are isolated from each other by various kinds of isolation structures. In one embodiment, a cavity is formed in one layer of the avalanche photodiode that extends to a depletion region that exists in the layer as a result of a voltage applied to the device. The plurality of contacts are formed in the cavity so that each of the contacts are positioned substantially adjacent the depletion region. In another embodiment, a plurality of contacts are formed in a cavity and an isolation structure comprised of a grid of semiconductor material is formed so as to be interposed between adjacent contacts. The isolation structure preferably forms a p-n junction with the surrounding semiconductor material and the p-n junction provides isolation between adjacent contacts. Preferably, the inner surface of the cavity is distal from the boundary of the depletion region, however, the isolation structure preferably extends into the depletion region. In another embodiment, a voltage is applied to the isolation structure so that a depletion region is formed in the surrounding semiconductor material so that adjacent contacts are electrically isolated from each other by a combination of a p-n junction and a high resistivity depletion layer.

27 Claims, 5 Drawing Sheets

OTHER PUBLICATIONS

Weizer, V.G., Brandhorst, H.W., Broder, J.D., Hart, R.E., and Lamneck, J.H., "Photon–degradation effects in terrestrial silicon solar cells", *J. Appl. Phys.* 50(6), 4443–4449, Jun. 1979.

Stock, K.D., and Heine, R., "On the aging of photovoltaic cells", *Optik*, 71, No. 4 137–142, 1985.

Korde, Raj and Geist, Jon, "Stable, High Quantum Efficiency, UV–Enhanced Silicon Photodiodes by Arsenic Diffusion", *Solid–State Electronics*, vol. 30, No. 1, pp. 89–92, 1987.

LARGE AREA AVALANCHE PHOTODIODE ARRAY

BACKGROUND OF THE INVENTION

1. Field of the Invention

The present invention relates to a device for detecting light and, in particular, concerns a large area avalanche photodiode array that is capable of providing signals indicative of the spatial distribution of sensed light.

2. Description of the Related Art

Detectors that operate by sensing light are very valuable in high-tech applications. In particular, light detectors that are capable of detecting certain wavelengths of light are used as scientific sensors which sense the presence or absence of certain molecules within a sample based upon detecting light of a given wavelength emanating from the sample when the sample is illuminated. Further, these sensors are also used for image capture systems that capture light emanating from an object and produce one or more electrical signals that correspond to the captured light.

A number of electronic devices have been developed that are currently used for light detection. One such device is a charge couple device (CCD) which is essentially comprised of a plurality of MOS structures that, in response to receiving a specific quantity of light, e.g., a specific light level, store a signal that is indicative of the receipt of the light. One particular advantage of a CCD is that it can be arranged into an array which will provide a plurality of signals indicative of the light received over an area. Hence, a CCD camera can be used to capture an image from received light.

One limitation of CCD's and other commonly used light sensing devices, such as PiN diodes, is that these types of devices do not have any internal amplification. Hence, when these types of devices receive low levels of light, the devices may not respond or sense if the light falls below a given sensitivity threshold for the devices. Subsequent electronic amplification of the signal produced by the sensor is then relatively ineffective in producing a useful signal for these low intensity applications. Consequently, these types of devices are not particularly well-suited for low-light applications wherein low intensities of light are being detected.

One device which has internal amplification and is particularly well-suited to low-intensity sensing is known as a large area avalanche photodiode device (LAAPD). U.S. Pat. No. 5,057,892 to Iwanczyk provides one example of such an avalanche photodiode device. Typically, a large area avalanche photodiode device is comprised of a p-n junction that is reversed biased by an applied voltage, oftentimes on the order of 2,000 to 3,000 volts. This results in an enhanced depletion region forming at the p-n junction of the LAAPD. When a photon impinges on a first surface of the LAAPD, charge carriers are produced and these charge carriers are swept by the electric field produced as a result of the applied voltage towards the p-n junction. This results in the charge carriers reaching the high electric field at the nearby metallurgical p-n junction and by colliding with other charge carriers thereby producing an avalanche of charge carriers. It will be appreciated that this avalanching effect results in an amplified electrical signal being produced by the LAAPD that is proportionate to the quantity of light that is incident on the light receiving surface of the LAAPD. Consequently, LAAPD's, such as the device disclosed in U.S. Pat. No. 5,057,892, provide sensors that are particularly adaptable to low intensity applications.

However, it is generally understood that the LAAPD's similar to the device disclosed in U.S. Pat. No. 5,057,892 produce a single output signal regardless of the spatial distribution of the light when the light impinges on the light receiving surface of the LAAPD. Consequently, these devices are generally only capable of providing a single signal which is indicative of the presence and the intensity of light incident on the LAAPD but these devices are not capable of providing signals that are indicative of the spatial distribution of light of varying intensities. Hence, LAAPD's of this type are generally not suited for producing images as this requires a sensing device that is capable of receiving light and producing a plurality of signals indicative of the different intensities of light over a continuous area.

U.S. Pat. No. 5,021,854 to Huth discloses a large area avalanche photodiode device that addresses this particular problem. This patent discloses a device that has an array of contacts corresponding to an array of pixels formed on one side of the device that is capable of providing a plurality of signals indicative of the different intensities of light incident on different spatial areas of the avalanche photodiode's light receiving surface. Hence, this type of device can be used to produce an image of the light that is emanating from a particular region. However, the device disclosed in U.S. Pat. No. 5,021,854 has some problems in providing a clear composite signal indicative of the spatial distribution of light of varying intensities.

In particular, in one embodiment disclosed in U.S. Pat. No. 5,021,854 the contacts are formed in the n-region of the semiconductor device. These contacts are therefore positioned adjacent each other and are only separated by the n-doped silicon layer of the device. It will be understood that the contacts are positioned on the bottom surface of the device where they are located away from the p-n junction. Consequently, these contacts are positioned outside of the depletion region that is formed as a result of the voltage that is applied across the device. Hence, the contacts are positioned substantially adjacent each other and are only separated by a relatively low resistivity region of n-type silicon.

As a result, there is practically no electrical separation between the pixels and the device does not work well as an APD array. This phenomenon is referred to as cross-talk and it limits the ability of the array in prior art devices of this type to provide electrical signals indicative of the spatial distribution of light impinging on the device.

One possible solution to this problem would be to extend the depletion layer towards to bottom surface by increasing bias or changing the doping profile of the device. However, the depletion layer is generally curved towards the bottom surface of the device in the typical bevelled edge avalanche photodiode. Moving the depletion layer towards the bottom surface can result in the boundary of the depletion region contacting the bottom surface which results in short circuiting of the avalanche photodiode.

U.S. Pat. No. 5,021,854 also discloses a different LAAPD design that attempts to address some of these problems. In this design, the contacts are separated by deep grooves that are cut into the device so as to extend from the back surface of the n-region through the p-n junction into the p-region so that the contacts are electrically isolated from each other and also so that drifting charge carriers are physically prevented from travelling to adjacent contacts. While this does substantially reduce the problem of cross-talk between contacts, U.S. Pat. No. 5,021,854 describes these deep grooves as being formed by using a diamond cutting wheel or some other mechanical cutting device. The production costs of LAAPD incorporating these grooves is, therefore, very significant.

Further, in order to reduce the electric field that results from the applied voltage, the grooves disclosed in U.S. Pat. No. 5,021,854 generally have to be beveled so that the distance between the active portion of the upper contacts becomes very large. Consequently, a large percentage of the area of the LAAPD is occupied by these grooves which further reduces the active area of the LAAPD and fewer contacts can be positioned on the LAAPD. In effect, a separate bevelled edge avalanche photodiode is created for each pixel contact at a great loss of sensitive area, production expense and material cost.

Hence, there is a need for a large area avalanche photodiode that is capable of providing signals that are indicative of the spatial distribution of light of different intensities as the light is incident on the LAAPD that is relatively inexpensive to manufacture. To this end, there is a need for an LAAPD array device that has a plurality of contacts that are adequately electrically isolated from each other so that clear signals of the spatial distribution of light that is incident on the LAAPD are produced.

SUMMARY OF THE INVENTION

The aforementioned needs are satisfied by the avalanche photodiode device of the present invention which, in a first aspect, is comprised of a semiconductor wafer having a first layer of semiconductor material of a first type with a second layer of semiconductor material of a second type positioned thereon wherein a voltage is applied to the device so that the junction between the first and second layer of semiconductor material is reversed biased and so that a depletion region is formed in the first layer of semiconductor material. A cavity is formed in a back surface of the first layer of material so that the back surface of the cavity is substantially adjacent the depletion region that is formed as a result of the applied voltage. A plurality of pixel contacts are formed on the inner surface of the cavity. When light is incident on the device, the incident photons generate charge carriers that are swept through the depletion region into the high electric field region where avalanche occurs. Charge carriers then drift into the pixel contacts of the device in a direction that is perpendicular to the contact without significant horizontal spread of the carriers. This results in more charge carriers being collected at the contacts that correspond to the spatial position where the light was incident. Preferably, the positioning of the pixel contacts within the cavity provides improved isolation between adjacent contacts to thereby reduce cross-talk.

In one embodiment, the cavity is formed in the back surface of the first layer of semiconductor material so as to extend towards the depletion region to thereby reduce the undepleted region of the device. The plurality of pixel contacts are then formed in the cavity preferably using planar processing techniques. Further, one or more isolation structures can be formed within the cavity around the pixel array so that the interpixel conductivity is reduced. For example, in one embodiment, the first layer of semiconductor material is comprised of n-type silicon and the cavity is formed in the bottom layer of the n-type silicon so as to be adjacent the depletion region. A plurality of p-type silicon isolation structures are then formed using well-known planar processing techniques, such as diffusion deposition or implantation techniques, so that the p-type silicon isolation structures are interposed between adjacent pixel contacts and thereby result in enhanced electrical isolation between each of the contacts.

In another embodiment of the present invention, the isolation structure is biased with respect to the first layer of semiconductor material so that a depletion region is formed between the isolation structures and the surrounding semiconductor material. Preferably, the isolation structures are sufficiently reversed biased so that the depletion region that results from the biasing of the isolation structure extends into the depletion region formed by the reverse biasing of the junction formed between the first and second layers of semiconductor material. In this embodiment, the contacts are significantly isolated from each other by the p+ isolation structures and a high resistivity depletion region wherein the charge carriers have been depleted from the region as a result of an applied electrical voltage. In this embodiment, a further benefit of applying the reverse biasing voltage to the isolation structure is that it allows the depletion region formed as a result of the bias applied to the device to be kept away from the bottom surface of the device.

In another embodiment, a cavity is formed in the bottom surface of a photodiode. A plurality of pixel contacts are then formed in the bottom surface of the cavity and isolation structures that are preferably comprised of grooves are then formed between adjacent pixel contacts using either etching or mechanical cutting techniques. The grooves can be cut so as to extend into the depletion region so that isolation between adjacent pixel contacts is maintained. In another embodiment, an electrical contact, preferably comprised of p-type silicon is implanted, diffused or deposited into the bottom of the grooves and a voltage can be applied to the p-type silicon. If the avalanche photodiode is formed in n-type silicon, the biased p-type silicon in the grooves can further be used to isolate adjacent pixel contacts.

Advantageously, with the grooves, the cavity does not have to be formed as deeply into the silicon wafer or even formed at all. Hence, the thickness of the overall wafer can be maintained to a high degree which preserves the mechanical stability of the device. Further, the voltage that is applied across the junction in the avalanche photodiode and the voltages applied to the p-type isolation structures can be independently adjusted to obtain desired parameters of the device, such as gain, signal to noise ratio, rise time, etc. In each of the embodiments disclosed, the isolation structures can either be in the form of rings surrounding each pixel contact or a grid that separate adjacent pixel contacts.

It will be appreciated that the avalanche photodiode devices of the present invention allow for a plurality of pixel contacts to be positioned on the device in a desired spatial orientation so that each individual pixel contact will receive different amounts of charge carriers as a result of light being incident upon different corresponding locations on the device. Consequently, the device provides one or more signals that are indicative of the spatial distribution of light having different intensities that is incident on the device. The device provides good isolation between the pixel contacts and thereby eliminates cross-talk by positioning the contacts substantially adjacent a high-resistivity depletion region, by forming isolation structures between the adjacent contacts or some combination thereof. These and other objects of the present invention will become more fully apparent from the following description taken in conjunction with the accompanying drawings.

DETAILED DESCRIPTION OF THE PREFERRED EMBODIMENT

Figure 1A:
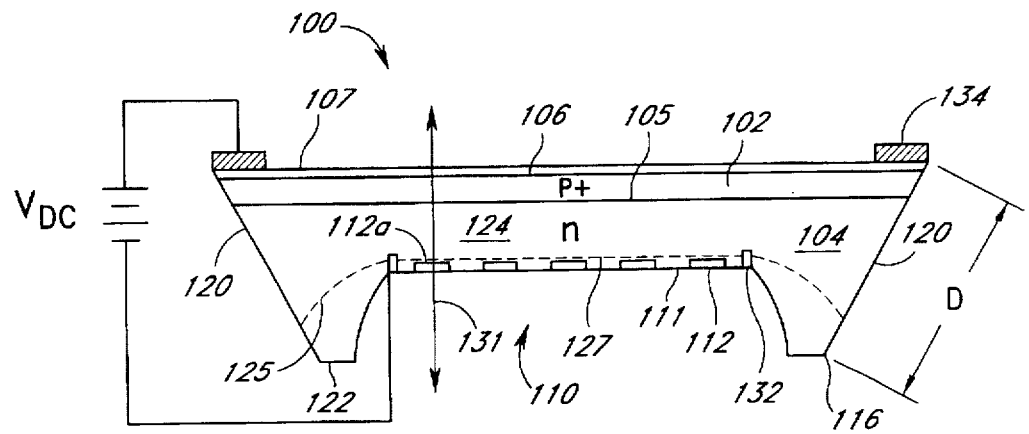
FIG. 1A is a schematic illustration of an avalanche photodiode array device having a cavity formed on one side.
Figure 1B:
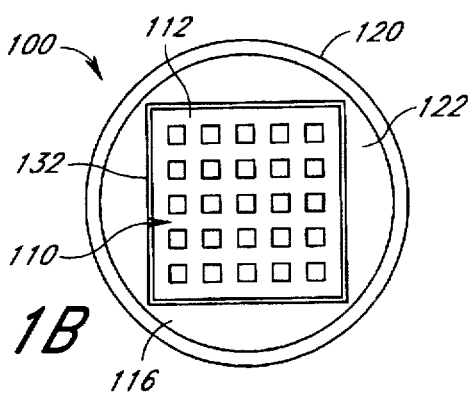
FIG. 1B is a bottom view of the avalanche photodiode of FIG. 1A further illustrating the cavity with an array of pixel contacts formed therein.

Reference will now be made to the drawings wherein like numerals refer to like parts throughout. FIGS. 1A and 1B illustrate a preferred embodiment of a large area avalanche photodiode array device 100 wherein a plurality of pixel contacts are formed on the device and provide a plurality of signals wherein each signal is indicative of the intensity of light that is incident on a particular area of the avalanche photodiode device 100. Hence, the device 100 is capable of providing signals that are indicative of the spatial distribution of light of varying intensities.

In particular, the device 100 is comprised of a first layer of a first semiconductor material 104 and a second layer of a second semiconductor material 102 positioned thereon. As shown in the drawings, the first layer of semiconductor material 104 is preferably comprised of n-type silicon and the second layer of semiconductor material 102 is comprised of p-type silicon so that a p-n junction 105 is formed therebetween. In the preferred embodiment, the n-type silicon layer 104 preferably has a resistivity between 30 ohms cm and 100 ohms cm which has been made by standard doping techniques, such as neutron doping, are used to attain a particularly uniform doping profile and the p-type silicon layer 102 has a peak doping concentration on the order of approximately $10^{15}$–$10^{20}$ dopant atoms per $cm^3$. It will be appreciated by a person of ordinary skill in the art, that the doping concentration of either the p-layer 102 or the n-layer 104 can be advantageously varied using epitaxial growth techniques in the manner described in the assignee's copending U.S. provisional patent application entitled "AVALANCHING SEMICONDUCTOR DEVICE HAVING AN EPITAXIALLY GROWN LAYER", Ser. No. 08/675,161 filed Jul. 3, 1996 and petitioned to be converted to a provisional application on Jan. 10, 1997.

An outer surface of the p-layer 102 defines a light receiving surface 106 wherein light that is to be detected is incident upon the device 100. As shown in FIG. 1A, the light can be spatially distributed so as to be incident anywhere along the surface 106 through a window region 107. As will be discussed in greater detail hereinbelow, when light is incident upon different regions or locations of the surface 106, different electrical contacts, also referred to as pixel contacts, located in the first layer of semiconductor material 104 provide different electrical signals. These electrical signals are proportionate the intensity of the light incident at different locations on the surface 106 and are thus indicative of the spatial distribution and intensity, i.e., the intensity distribution, of the incident light.

FIGS. 1A and 1B illustrate that the layer of n-type silicon 104 has a cavity 110 formed in an outer surface 122. The cavity 110 extends inward toward the junction 105. The cavity 110 is formed through well-known planar processing techniques, such as patterning and etching, or can also be formed using chemical-mechanical polishing (CMP) techniques. In this embodiment, the cavity 110 extends into the n-region 104 a distance sufficient so that a bottom surface 111 of the cavity is located substantially adjacent the boundary (represented by a dashed line 125) of a depletion region 124 that is formed as a result of a voltage $V_{dc1}$ being applied across the p-n junction 105.

In particular, it is understood that an avalanche photodiode typically has a DC voltage applied across a p-n junction so as to heavily reverse bias the p-n junction. The DC voltage can be about 1,500 to 3,000 volts. This heavy reverse bias of the p-n junction 105 creates an avalanching effect whereby a plurality of charge carriers are produced in response to the generation of a single charge carrier in the p-region 102 resulting in a photon impinging on the light receiving surface 106. In this respect, the operation of the avalanche photodiode array device 100 is substantially the same as the operation of large area avalanche photodiode devices of the prior art.

However, in the device 100, there are a plurality of contacts 112 that are formed in the bottom surface 111 of the cavity 110. The contacts 112 are preferably non-injecting contacts that are formed using well-known diffusion or implantation techniques so as to be highly n+ doped (e.g., having a doping concentration on the order of $10^{17}$ dopant atoms per $cm^3$ or more). The contacts 112 provide electrical signals to an exterior sensing device (not shown) in response to light incident upon the light receiving surface 106 of the device 100.

In particular, as one or more photons of light are incident upon a particular point of the surface 106, there is a statistical likelihood that the photons will generate one or more electron hole pairs within the p-region 102 of the device 100. The applied voltage $V_{dc1}$ creates an electrical field across the junction 105 which sweeps the charge carriers across the junction 105 whereby the charge carriers collide with other charge carriers thereby producing an avalanche of charge carriers that are swept towards the bottom surface 111 of the cavity 110. The concentration of charge carriers that are swept across the junction is, of course, greatest in the region of the device 100 that is located in the same line of the device 100 as the point where the light is originally incident on the device. For example, the contact 112a that is located within the same vertical line of the device 100, as represented by the line 131, as the point where the light is originally incident receives a greater number of charge carriers than the contacts 112 located away from the line 131. In this manner, the plurality of contacts 112 can provide signals that are indicative of both the spatial distribution of light that is received on the light receiving surface 106 and the intensity of the light at different locations.

In the device 100 shown in FIG. 1A, the contacts 112 are positioned adjacent the depletion region 124, which reduces cross-talk between adjacent pixel contacts 112. This high resistivity depletion region 124 inhibits the migration of charge carriers from one of the contacts 112 to an adjacent contact 112 and thereby reduces cross-talk. Consequently, the device 100 of the preferred embodiment is better suited than prior art devices for providing signals that are indicative of the spatial distribution of light that is received by the device 100.

FIGS. 1A and 1B further illustrate that the preferred embodiment of the device 100 also incorporates one or more guard ring structures 132 that are implanted inside of the cavity 110. The guard ring structures 132 are preferably grounded so as to protect the plurality of contacts 112 from surface current arising as a result of the applied voltage $V_{dc1}$. Further, the voltage $V_{dc1}$ is preferably applied to a ring contact 134 that is formed on the light receiving surface 106 of the device 100. The guard ring 132 and the ring contact 134 can be formed in the device 100 using any of a number of well-known techniques, including diffusion based planar processing techniques or implantation techniques.

FIG. 1B provides an exemplary bottom view of the device 100. As shown, the cavity 110 is formed in the device 100. The cavity 110 is inset from an interface 116 between the beveled edge 120 and the bottom surface 122 of the device 100. Further, as shown in FIG. 1B, the contacts 112 are distributed throughout the cavity 110 so as to substantially cover the cavity 110. In the preferred embodiment, the contacts 112 are about 1 mm×1 mm square and are spaced apart by a distance of approximately 300 µm. In one embodiment, the device 100 is comprised of a large area avalanche photodiode device that has an 16 mm diameter, and the cavity 110 is approximately 11.2 mm×11.2 mm. It will be appreciated that the devices described herein can be used in any Large Area Avalanche Photodiode Device application and have a cavity on the order of 0.10–10 cm². In this area and maintaining the above-described insulation between adjacent contacts 112, approximately 50 pixel contacts can be positioned within the cavity 110. It will be appreciated that any number of contacts 112 can be positioned within the cavity so long as there is a sufficient distance between adjacent members of the contacts to maintain the desired electrical isolation between the contacts. Consequently, a composite signal can be prepared from the contacts 112 which is indicative of the intensity distribution of light that is incident upon the device 100. This composite signal can be used for purposes such as low-light imaging.

It will be appreciated that it may be difficult to form the cavity 110 in the first layer 104 of the device 100 so that the contacts 112 of the cavity are positioned exactly at the boundary 125 of the depletion layer 124. It will be understood that slight changes in the doping profile of the layers 102 and 104 can result in slight variances in the boundary 125 of the depletion layer 124. Further, the inner surface 111 of the cavity 104 must be extremely planar, e.g. having tolerances on the order of 1–2 microns or less to ensure that the contacts 112 are correctly positioned in the depleted silicon 124. If two adjacent contacts 112 can be positioned outside of the depletion region 124 so that the two contacts are only separated by relatively low resistivity silicon, the two contacts effectively act as a single contact. It will be appreciated that this difficulty is exacerbated in applications that have a significant number of contacts 112 positioned in the cavity 111 so that the contacts 112 are positioned very close to each other.

Figure 2A:
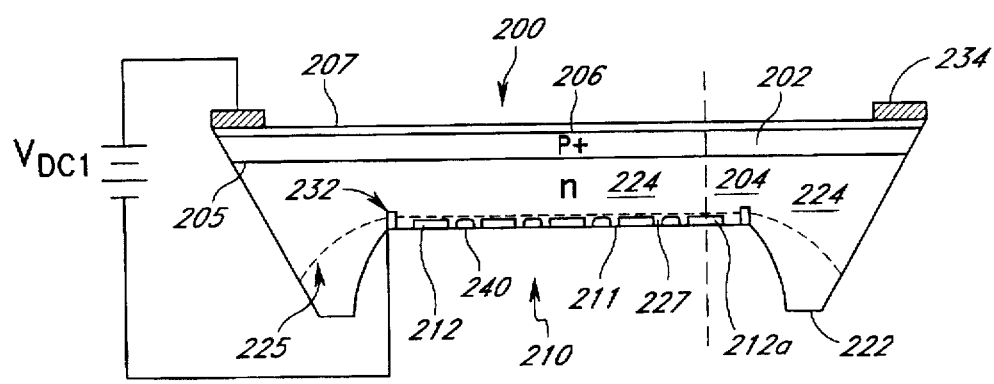
FIG. 2A is a second embodiment of an avalanche photodiode array device having a cavity with a plurality of pixel contacts formed therein wherein the plurality of contacts are isolated by one or more isolation structures.
Figure 2B:
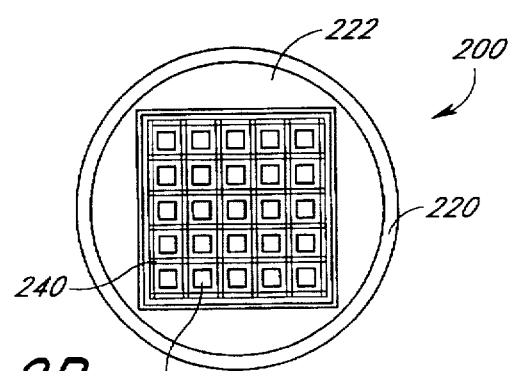
FIG. 2B is a bottom view of the avalanche photodiode array device of FIG. 2A.

To address this problem, the embodiment shown in FIGS. 2A and 2B has been developed. In particular, the device 200 of FIG. 2A includes a layer of n-type silicon 204 with a layer of p-type silicon 202 positioned thereon so as to form a p-n junction 205. The p-n junction 205 is reversed biased by a voltage source $V_{dc1}$ in the same manner as described above so as to create a depletion region 224. A cavity 210 is formed in the bottom surface of the layer of n-type silicon 204 except that in this embodiment the cavity 210 does not extend to the depletion region boundary 225. A plurality of n+ silicon contacts 212 are deposited on the surface 211 of the cavity 210 using well-known implantation or diffusion techniques.

However, one or more isolation structures 240 are also formed on the surface 211 using either diffusion or implantation techniques so as to electrically isolate each of the n+ contacts 212 from each other. FIG. 2B illustrates that the n+ contacts 212 are deposited over the entire inner surface of the cavity 210 and the one or more isolation structures 240 are preferably comprised of a grid of p+ silicon that separate each of the n+ contacts 212. Preferably, the p+ structure 240 is diffused or implanted into the surface 211 of the cavity 210 so as to extend to the boundary 225 of the depletion region 224. Consequently, isolation between each of the adjacent contacts 212 is enhanced by the p+ isolation structures 240.

In particular, the isolation structures 240 inhibit migration of charge carriers between adjacent contacts as it forms a p-n junction between the adjacent contacts 212. It will be further appreciated that using standard planar processing techniques, many contacts 212 can be positioned within the cavity 210 with very little separation and still be adequately isolated from one another by forming the isolation structure 240 using well-known planar processing techniques. Hence, the minimum separation of the contacts 212 can be reduced without significant loss of electrical isolation as there is effectively a p-n junction interposed between each of the contacts 212. Hence, the packing density of contacts 212 in the cavity 210 is more a function of the processing techniques used to form the contacts 212 and the isolation structure 240.

In the embodiment shown in FIGS. 2A and 2B, the isolation structure 240 extends into the depletion region 224 so as to ensure adequate isolation between adjacent contacts 212. It will be appreciated that the isolation structure 240 and the contacts 212 can be formed on the bottom side 222 of the n-type silicon layer 204 without the formation of the cavity 210. However, to achieve the desired isolation between the contacts 212, the isolation structure 240 will preferably extend into the depletion region 224.

As discussed above, the cavity allows the contacts to be positioned closer to the depletion region. Hence, the isolation structure does not have to be grown or implanted as deeply into the first layer to achieve isolation between adjacent contacts.

Figure 3A:
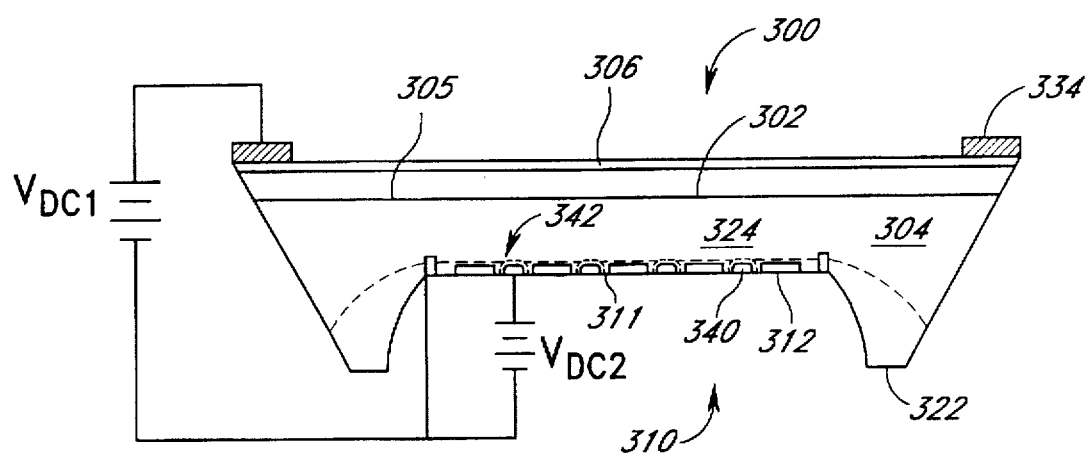
FIG. 3A is a schematic illustration of a third embodiment of an avalanche photodiode array device incorporating one or more isolation structures to further isolate a plurality of pixel contacts from each other wherein an electrical potential is applied to the one or more isolation structures.

FIG. 3A illustrates another embodiment of an avalanche photodiode array 300 wherein a cavity 310 is formed in a bottom surface 322 of the device 300. The construction of the device 300 is similar to the construction of the devices described above in reference to FIGS. 1 and 2. However, a voltage supply $V_{dc2}$ is connected to the isolation structure 340 so that the isolation structure 340 is reversed biased with respect to the n-layer 304. This results in a depletion region 342 being formed between the isolation structure 340 and the layer 304. Consequently, the isolation structure 340 provides an electrically produced high resistance isolation region between adjacent pixel contacts that reduces crosstalk between adjacent contacts 312.

As shown in FIG. 3A, the voltage applied to the isolation structures 340 can be configured so that the depletion region 342 extends all the way into the depletion region 324 that results from the reverse biasing of the p-n junction 305 as a result of the applied voltage $V_{dc1}$. Consequently, each of the contacts 312 are then separated from each other by either the p-n junction formed between the isolation structure 340 and the n-type silicon 304 or the depletion regions 324 or 342. Hence, the contacts 312 are electrically isolated from each other either by the p-n junction or by a high resistivity depletion region.

It will be appreciated that applying the voltage $V_{dc2}$ to the isolation structure 340 allows the isolation structure 340 to be positioned farther away from the depletion region 324 and still maintain adequate isolation of the contacts 312. Consequently, the cavity 310 does not have to be as deep which increases the mechanical integrity of the device 300. Further, the presence of the isolation structure 340, when the bias is applied, permits the surface 311 of the cavity 310 to be positioned farther from the boundary 325 of the depletion layer 324. Hence, the depletion layer 324 is less likely to reach the surface 311 as a result in variations in the applied voltage which reduces the likelihood of the problems associated with electron injection described above. It will be appreciated that by applying the voltage $V_{dc2}$ to the isolation structure 340, can result in the boundary 325 of the depletion layer 324 being pushed away from the surface 311. Consequently, a greater bias can be applied to the device 300 without increasing the risk of the depletion layer 324 making contact with the surface 311. It will be appreciated that, in some circumstances, a greater bias across the junction 305 can result in the device having improved performance parameters such as improved range of gain.

Further, it will be appreciated that the two voltage source $V_{dc1}$ and $V_{dc2}$ can be varied, the applied voltages can be varied in order to achieve desired parameters for the device such as gain and other parameters for the device. In particular, the applied voltage $V_{dc1}$ affects the gain that occurs across the p-n junction 305 and the resulting avalanching of charge carriers. Hence, by varying the two voltages, the depletion region 342 can be adjusted to meet the depletion region 324 and pinch off the area between the adjacent pixel contacts 312 and thereby attain a desired insulation between pixels.

Figure 3B:
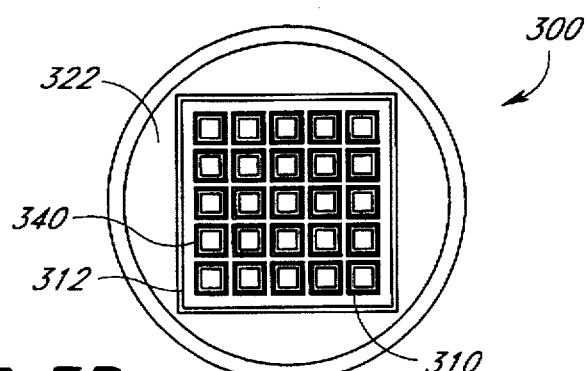
FIG. 3B is a bottom view of the avalanche photodiode array device of FIG. 3A.

The isolation structure 340 of the device 300 can either be a grid-type structure, as shown in FIG. 2B, or can be comprised of the isolation structures 341 shown in FIG. 3B. In particular, FIG. 3B illustrates that a plurality of pixel contacts 312 are positioned within the cavity 300 of the device. Each pixel contact is surrounded by a ring of p+ material 341 so as to provide the electrical isolation between adjacent pixel contacts 312. A wire bond, not shown, is attached to each of the isolation rings 341 so that the isolation rings 341 can have a voltage applied thereto and provide the isolation between adjacent pixel contacts 312 in the manner described above. In some circumstances, it may be advantageous to use individual isolation rings 341, as opposed to an isolation grid 340, as the voltages applied to each of the isolation rings can be varied to achieve different isolation characteristics of the device.

Figure 4:
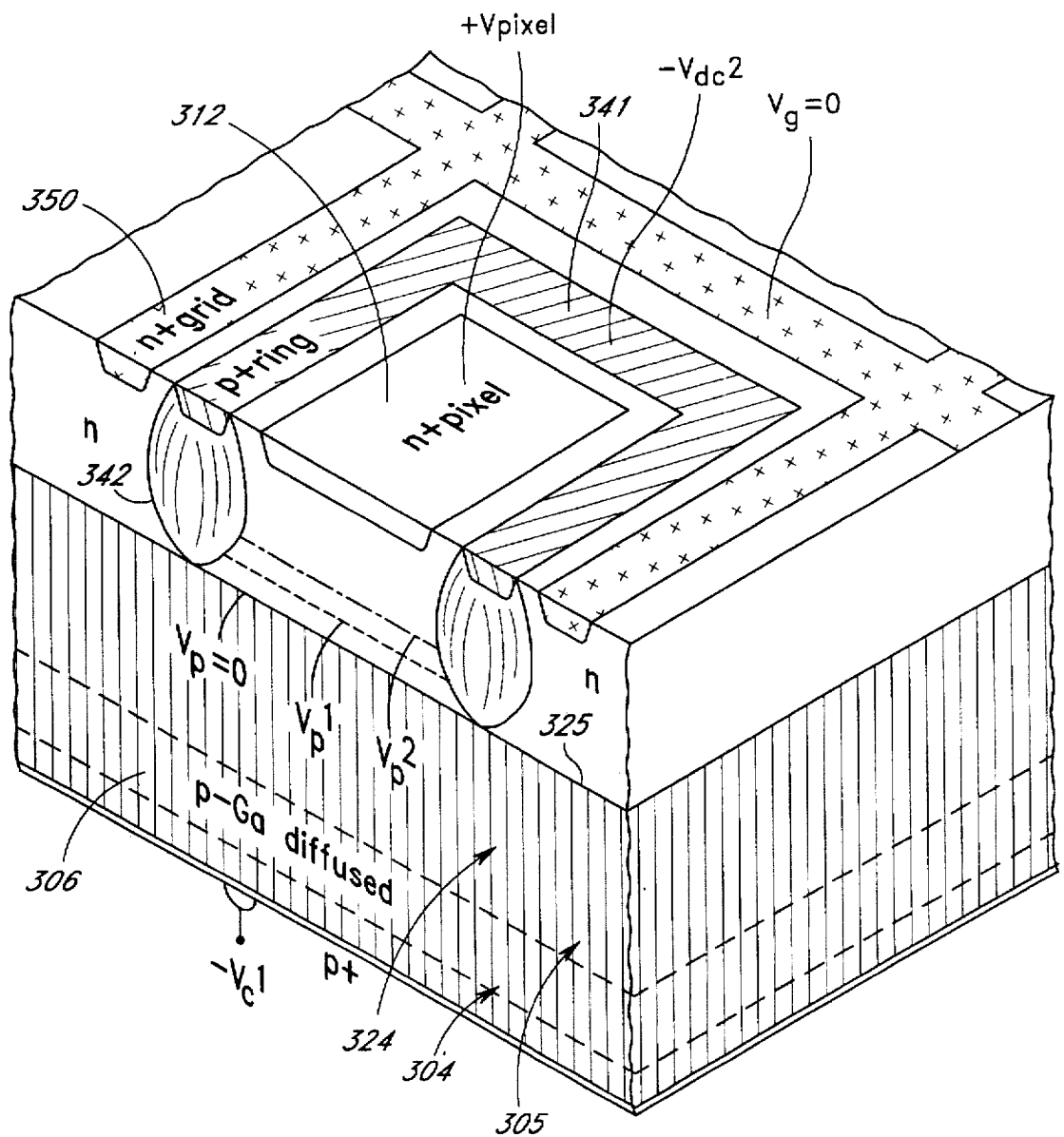
FIG. 4 is a partial cross-sectional view of the avalanche photodiode array device of FIGS. 3A and 3B.

FIG. 4 illustrates a single pixel contact 312 of the device 300 shown in FIGS. 3A and 3B in greater detail. As shown, the n+ pixel contact 312 is positioned inside of a p+ ring structure 341 so that the pixel contact 312 is separated from an adjacent pixel contact 312 by the p+ ring structure 341. The voltage $V_{dc2}$ is applied to the ring structure 341 so that the depletion region 342 extends into the device 300 so as to reach the depletion region 324 and pinch off the device. Further, an n+ grid 350 can also be positioned on the bottom surface 311 of the cavity 310 using standard implantation or diffusion techniques so as to be positioned between adjacent ring structures 341. The grid 350 is preferably grounded and the purpose of the grid 350 is to provide additional isolation between adjacent pixel contacts as the grid helps to reduce the transfer of charge carriers by surface currents traveling along the surface 311 of the cavity 310. The n grid 350 acts as a guard ring to inhibit surface currents from travelling between adjacent pixel contacts 312. In the embodiment shown in FIG. 4, there is an isolation ring or structure 351 that surrounds each pixel contact 312 and the isolation structures. In other embodiments, the isolation structure is comprised of a grid of deposited p+ material. In those embodiments, there will typically be only n guard ring or guard rings that surrounds all of the pixel contacts and the isolation structures. In fact, these guard rings could comprise a ground contact positioned on the surface 322 of the layer 304 or on the surface 332 inside the cavity 310 at a point outside the periphery of the contacts and isolation structures that preferably provides a ground.

Figure 5A:
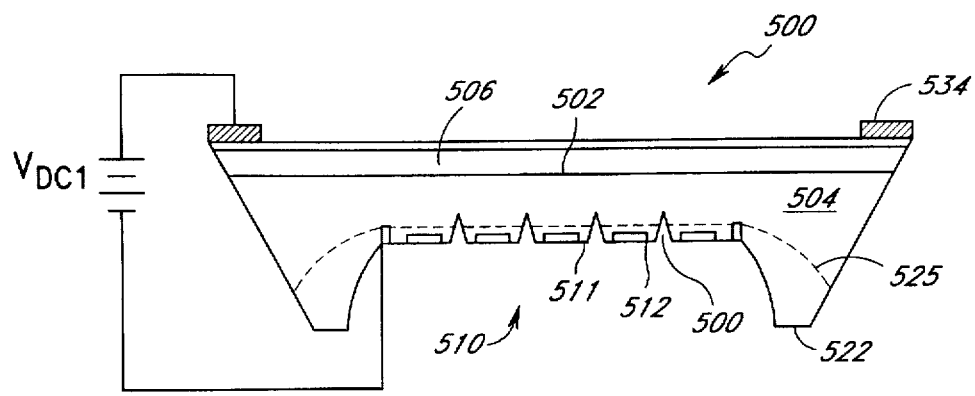
FIG. 5A is a fourth embodiment of an avalanche photodiode array device having a cavity and a plurality of pixel contacts formed therein, wherein the plurality of pixel contacts are separated form each other by one or more grooves formed in the cavity.
Figure 5B:
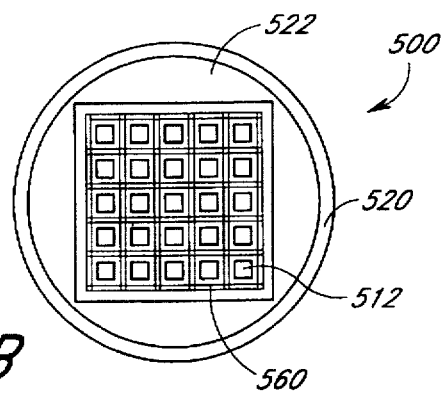
FIG. 5B is a bottom view of the avalanche photodiode array device of FIG. 5A.

FIGS. 5A and 5B illustrate another embodiment of an avalanche photodiode array device 500. The avalanche photodiode array device 500 shown in FIGS. 5A and 5B is similar to the avalanche photodiode array devices 100, 200 and 300 shown in FIGS. 1A through 3B in that the device includes a layer of n-type material 504 and a layer of p-type material 506 positioned thereon to form a p-n junction 505. The p-n junction 505 is reversed biased by a voltage $V_{dc1}$ so as to define a depletion region 524. A cavity 510 is formed on the bottom side of the n-layer 504 and a plurality of pixel contacts 512 are formed at a bottom surface 511 of the cavity 510.

However, in this embodiment, a series of grooves 560 are interposed between adjacent pixel contacts 512 and the grooves 560 preferably extend to the boundary 525 of the depletion layer 524. The grooves 560 can be formed in the cavity 510 through the use of mechanical cutting techniques or etching processes. Hence, adjacent pixel contacts 512 are isolated from each other by the grooves 560. Consequently, cross-talk between adjacent pixel contacts 512 is minimized as the grooves 560 effectively form a high resistance barrier to cross talk between adjacent pixel contacts 512. It will be appreciated that one advantage of forming the grooves 560 at the bottom of the cavity 510 is that the cavity 510 does not have to extend as far into the layer of n-type silicon 504. Hence, the device 500 has greater mechanical support as a result of the average thickness of the device 500 being increased.

Figure 6A:
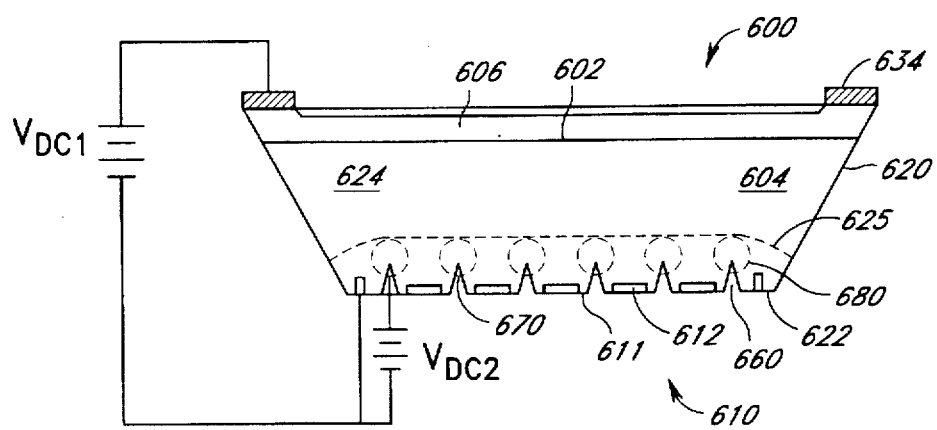
FIG. 6A is a fifth embodiment of an avalanche photodiode array device having a plurality of pixel contacts formed on a back side of the device, wherein the plurality of contacts are separated by a plurality of grooves formed in the device that have electrical contacts formed in the grooves.
Figure 6B:
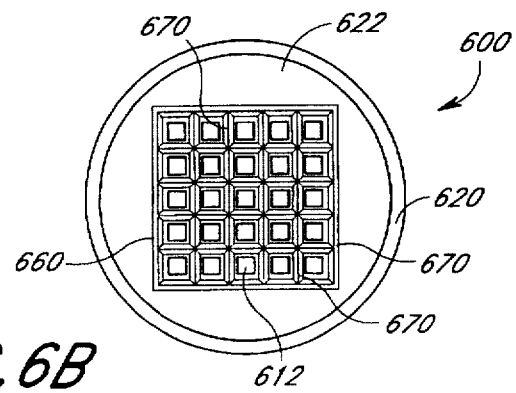
FIG. 6B is a bottom view of the avalanche photodiode device of FIG. 6A.

FIGS. 6A and 6B illustrate another embodiment of an avalanche photodiode array device 600. This device is similar to the previously described embodiments in that it is comprised of a beveled edge avalanche photodiode having a layer of p+ material 606 positioned on a layer of n-type material 604 to define a junction 605 therebetween that is reversed biased by a voltage $V_{dc1}$. A plurality of pixel contacts 612 are formed on a bottom surface 622 of the device 600. Further, a plurality of grooves 660 are formed between adjacent pixel contacts 612 using either mechanical cutting techniques or well-known etching techniques. These grooves provide minimal isolation between adjacent pixel contacts 112 as they do not extend to the depletion region 625. Further, in this embodiment, an electrical contact comprising an electronic isolation structure 670 is formed at the bottom of the groove 660. In particular, in this embodiment p+ silicon material is deposited in the bottom of the grooves 660 using well-known implantation, diffusion or deposition techniques. A voltage $V_{dc2}$ is applied to the isolation structure 670 that is positioned at the bottom of the groove 660 which thereby produces a depletion region 680 in the n-layer of silicon 604.

Preferably, the combination of the grooves 660 extending into the n-layer 604 and the voltage $V_{dc2}$ applied to the isolation structure 670 results in the depletion layer 680 contacting the depletion layer 624 that occurs as a result of the voltage $V_{dc1}$ being applied across the junction 605. At this point, adjacent pixel contacts 612 are isolated from each other by the combination of the grooves 660, the region of depleted semiconductor material 680 and the region of depleted semiconductor material 624.

Consequently, the device 600 is capable of providing a signal that is more indicative of the spatial distribution of light impinging upon the light receiving surface of the device than prior art devices. Cross-talk between adjacent pixel contacts 612 is reduced as a result of the combination of the grooves and the regions of depleted semiconductor material that occur as a result of voltages being applied to isolation structures formed in the grooves. It will be appreciated that, in this embodiment, the overall thickness of the device 600 is substantially maintained as the individual grooves 660 in combination with the isolation structure 670 formed therein reduce the need for forming a cavity at the bottom surface 622 of the device 600. Consequently, the overall thickness and mechanical stability of the device can be improved.

It will be further appreciated that the embodiment shown in FIGS. 5A and 5B can be combined with the embodiment shown in FIGS. 6A and 6B so that a cavity is formed in the bottom surface of the device and grooves are formed between adjacent contacts positioned within the cavity and an isolation structure is positioned within the bottom of the grooves in the manner shown in FIG. 6B. This would result in the cavity not having to be as deep as the voltage applied to the isolation structure could result in the formation of a depletion region which contacts a depletion region that is formed across the junction between the p and the n regions and thereby provides isolation by pinching off the low resistivity semiconductor material between adjacent pixel contacts. It will also be appreciated that while the grooves in FIGS. 5 and 6 are in the form of a grid, they may also be formed in the form of rings in the same manner as described above.

Figure 7:
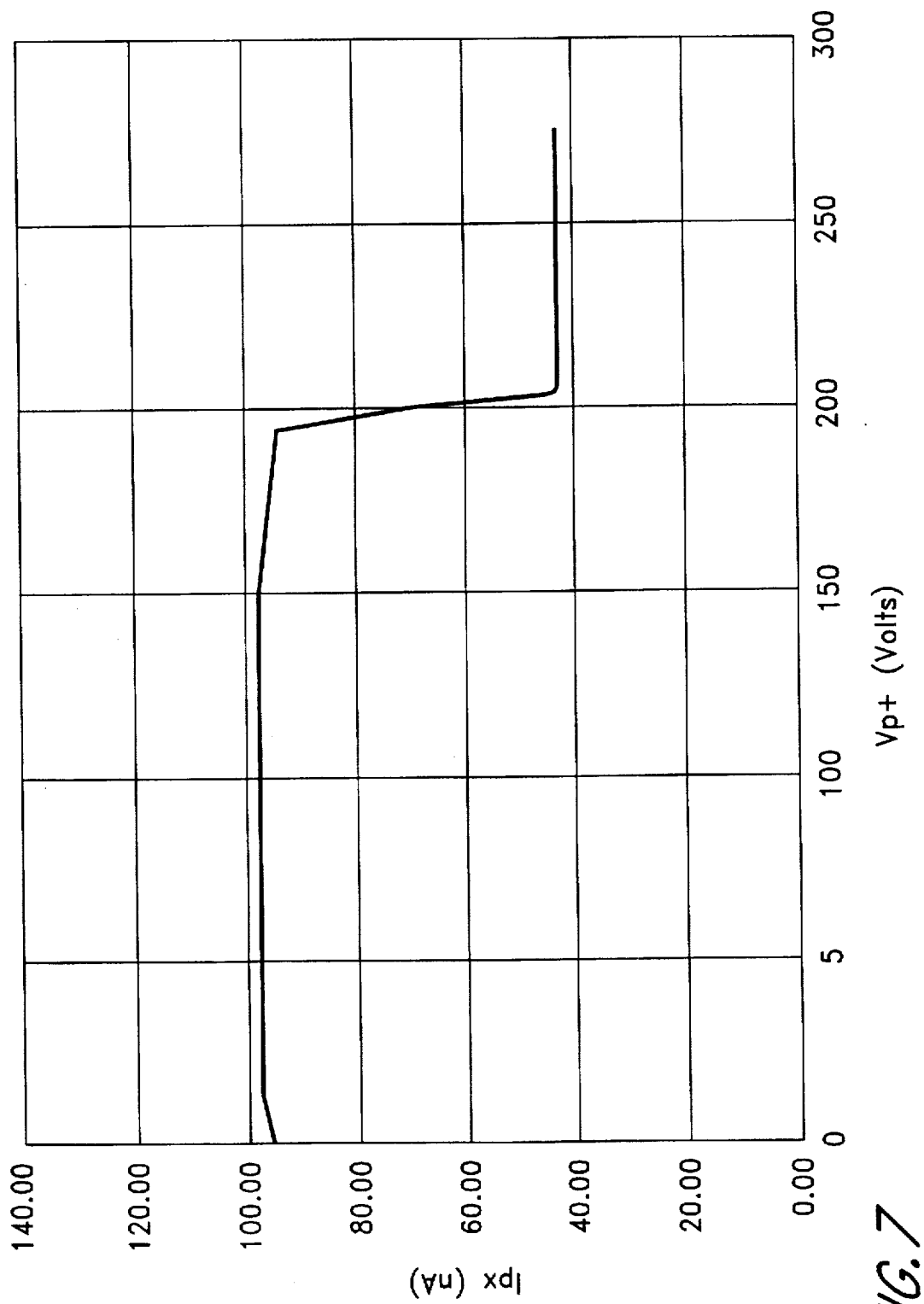
FIG. 7 is a schematic chart which illustrates the improved isolation effect between pixel contacts of an avalanche photodiode diode array device similar to the device illustrated in FIGS. 3A and 3B.

FIG. 7 is a chart which illustrates the operation of a device that Applicant has manufactured in accordance with the principles of the preferred embodiments described herein. Specifically, FIG. 7 illustrates the effectiveness of the isolation between pixels contacts in an avalanche photodiode array device that has an isolation structure which is electrically biased in the manner that is described above. As illustrated, when the voltage that is being applied to the isolation structure $V_{p+}$ (previously $V_{dc1}$) exceeds 200 volts for the tested device, the leakage that is detected at an adjacent isolated pixel contacts $I_{px}$ drops from approximately 90 nA to less than 40 nA. This is the result of the depletion region forming as a result of the bias applied to the isolation structure contacting the depletion region formed at the junction and pinching off the regions of undepleted semiconductor material in the first layer. The maximum value for the voltage $V_{p+}$ is, of course, the breakdown voltage of the p+ ring or grid that forms the isolation structure.

The foregoing embodiments of the present invention have illustrated an avalanche photodiode array device that has multiple contacts formed on the bottom side which can each provide a signal independent of the other of the intensity of light that is impinging upon a corresponding spatial position of a light receiving surface of the avalanche photodiode. Isolation between adjacent contacts is enhanced by positioning these contacts in a cavity so that they are proximate to a depletion region formed as a result of applying a biasing voltage to the avalanche photodiode. This isolation can be enhanced by forming isolation structures adjacent the contacts and also by reverse biasing the isolation structures so as to enhance the isolating effect.

Although the foregoing description of the preferred embodiment of the present invention has shown, described, and pointed out the fundamental novel features of the invention, it will be understood that various omissions, substitutions, and changes in the form of the detail of the apparatus as illustrated as well as the uses thereof, may be made by those skilled in the art without departing from the spirit of the present invention. Consequently, the scope of the invention should not be limited to the foregoing discussion, but should be defined by the appended claims.

What is claimed is:

1. An avalanche photodiode array device comprising:

a first layer of semiconductor material of a first type having a cavity formed therein;

a second layer of semiconductor material of a second type wherein said second layer is positioned on said first layer so as to form a junction therebetween and wherein said second layer defines a light receiving area;

a voltage source that applies a first voltage across said junction so that a first depletion region is formed in said first layer and so that when said junction is reversed biased an avalanche of charge carriers is produced in response to a photon penetrating into said device; and a plurality of contacts formed in said cavity wherein each of said contacts receive charge carriers in response to a photon penetrating into said device at a corresponding location in said light receiving area so that said plurality of contacts provide signals indicative of the spatial distribution of light impinging upon said light receiving surface of said device.

2. The device of claim 1, wherein said cavity extends into said first layer of semiconductor material so that said contacts are positioned adjacent said boundary of said depletion regions.

3. The device of claim 1, further comprising an isolation structure formed in said cavity so as enhance the electrical isolation between adjacent contacts.

4. The device of claim 3, wherein said isolation structure is formed from a semiconductor material selected so that an electrical junction is formed between said isolation structure and the surrounding material of said first semiconductor layer.

5. The device of claim 4, wherein said isolation structure extends inward from said inner surface of said cavity into said first depletion region in said first semiconductor layer.

6. The device of claim 3, wherein said isolation structure comprises a groove that is formed in said inner surface of said cavity between adjacent contacts.

7. The device of claim 6, wherein said grooves extend into said first depletion layer.

8. The device of claim 3, wherein said first semiconductor material is comprised of n-doped silicon having a resistivity in a range of between approximately 30 Ohm cm and 100 Ohm cm and said second semiconductor material is comprised of p-doped silicon having a peak doping concentration in a range between approximately $10^{15}$ dopant atoms per cubic centimeter and $10^{18}$ dopant atoms per cubic centimeter.

9. The device of claim 8, wherein said cavity has an area in a range between approximately $0.10\ cm^2$ and $10\ cm^2$ and said plurality of contacts are comprised of n+ doped silicon material that is formed on said inner surface using diffusion techniques.

10. An avalanche photodiode array device comprising:
   a first layer of semiconductor material of a first type;
   a second layer of semiconductor material of a second type wherein said second layer is positioned on said first layer so as to form a junction therebetween and wherein said second layer defines a light receiving surface;
   a voltage source that applies a first voltage across said junction so that a first depletion region is formed in said first layer and so that when said junction is reversed biased an avalanche of charge carriers is produced in response to a photon penetrating into said device through said light receiving area;
   a plurality of contacts formed on a surface of said first layer of semiconductor material wherein each of said contacts receive charge carriers in response to a photon penetrating into said device at a corresponding location in said light receiving area so that said plurality of contacts provide signals indicative of the spatial distribution of light impinging upon said light receiving surface of said device; and
   at least one solid isolation structure that is formed in said surface of said first layer so as to provide electrical isolation between adjacent contacts.

11. The device of claim 10, wherein the isolation structure comprises a semiconductor material of said second type.

12. The device of claim 10, wherein a cavity is formed in said first layer of semiconductor material so as to extend inward into said first layer towards said junction and wherein said surface of said first layer having said contacts and said at least one isolation structure formed thereon is comprised of an inner surface of said cavity.

13. The device of claim 12, wherein said cavity extends into said first layer a first distance and wherein said at least one isolation structure extends from said first surface a second distance wherein both said first and second distances are selected so that said at least one isolation structure extends into said depletion region.

14. The device of claim 10, wherein said first semiconductor material is comprised of n-doped silicon having a resistivity in a range of between approximately 30 Ohm cm and 100 Ohm cm and said second semiconductor material is comprised of p-doped silicon having a peak doping concentration in a range between approximately $10^{15}$ dopant atoms per cubic centimeter and $10^{18}$ dopant atoms per cubic centimeter.

15. An avalanche photodiode array device comprising:
   a first layer of semiconductor material of a first type having a cavity formed therein;
   a second layer of semiconductor material of a second type wherein said second layer is positioned on said first layer so as to form a junction therebetween and wherein said second layer defines a light receiving area;
   a voltage source that applies a first voltage across said junction so that a first depletion region is formed in said first layer and so that when said junction is reversed biased an avalanche of charge carriers is produced in response to a photon penetrating into said device;
   a plurality of contacts formed in said cavity wherein each of said contacts receive charge carriers in response to a photon penetrating into said device at a corresponding location in said light receiving area so that said plurality of contacts provide signals indicative of the spatial distribution of light impinging upon said light receiving surface of said device; and
   an isolation structure that is formed in said inner surface of said cavity so as to provide electrical isolation between adjacent contacts.

16. The device of claim 15, wherein said isolation structure extends inward from said inner surface of said cavity into said first depletion region in said first semiconductor layer.

17. The device of claim 15, wherein said first semiconductor material is comprised of n-doped silicon having a resistivity in a range of between approximately 30 Ohm cm and 100 Ohm cm and said second semiconductor material is comprised of p-doped silicon having a peak doping concentration in a range between approximately $10^{15}$ dopant atoms per cubic centimeter and $10^{18}$ dopant atoms per cubic centimeter.

18. The device of claim 15, wherein said cavity has an area in a range between approximately $0.10\ cm^2$ and $10\ cm^2$ and said plurality of contacts are comprised of n+ doped silicon material that is formed on said inner surface using diffusion techniques.

19. An avalanche photodiode array device comprising:
   a first layer of semiconductor material of a first type;
   a second layer of semiconductor material of a second type wherein said second layer is positioned on said first layer so as to form a junction therebetween and wherein said second layer defines a light receiving area;
   a voltage source that applies a first voltage across said junction so that when said junction is reversed biased an avalanche of charge carriers is produced in response to a photon penetrating into said device;
   a plurality of pixel contacts formed on a first surface of said first layer of semiconductor material, wherein each of said contacts receive charge carriers in response to a photon penetrating into said device at a corresponding location in said light receiving area so that said plurality of contacts provide signals indicative of the spatial distribution of light impinging upon said light receiving surface of said device; and
   one or more grooves formed only in said first surface of said first layer of semiconductor material, wherein said one or more grooves are configured to provide isolation between adjacent pixel contacts and to reduce cross talk therebetween.

20. The device of claim 19, wherein a first depletion region is formed in said first layer of semiconductor material adjacent said junction between said first and said second layers of semiconductor material.

21. The device of claim 19, wherein said one or more grooves are formed so as to extend into said first depletion region.

22. The device of claim 21, wherein said one or more grooves is comprised of a grid of grooves surrounding said plurality of pixel contacts.

23. The device of claim 19, wherein said one or more grooves is comprised of a plurality of rings of grooves that surround each of said pixel contacts.

24. A large area avalanche photodiode array device comprising:

a first layer of semiconductor material of a first type;

a second layer of semiconductor material of a second type wherein said second layer is positioned on said first layer so as to form a junction therebetween wherein said junction is greater than approximately 0.5 cm$^2$ and wherein said second layer defines a light receiving area;

a plurality of contacts formed on a surface of said first layer of semiconductor material wherein each of said contact receive charge carriers in response to a photon penetrating into said device at a corresponding location in said light receiving area so that said plurality of contacts provide signals indicative of the spatial distribution of light impinging upon said light receiving surface of said device; and at least one isolation structure that is formed in said surface of said first layer so as to provide electrical isolation between adjacent contacts wherein said isolation structure is formed only in said first layer between adjacent contacts so as to reduce cross-talk between adjacent contacts.

25. The device of claim 24, wherein said at least one isolation structure is comprised of one or more grooves that are formed in said first surface between adjacent contacts so as to isolate said contacts to reduce cross-talk therebetween.

26. The device of claim 25, wherein said at least one isolation structure is comprised of a solid isolation structure that is formed in said surface of said first layer so as to provide electrical isolation between adjacent contacts.

27. The device of claim 26, wherein said at least one solid isolation structure is comprised of an isolation structure that is made of semiconductor material that has a doping concentration selected to produce a depletion region adjacent the interface between the solid isolation structure and the surrounding first layer of semiconductor material.

* * * * *